(12) United States Patent
Bhatti (10) Patent No.: US 10,262,918 B1
(45) Date of Patent: Apr. 16, 2019

(54) HEAT TRANSFER COOLING MODULE

(71) Applicant: PATCO & ASSOCIATES, INC, Mansfield, OH (US)

(72) Inventor: Irfan Bhatti, Farmington Hills, MI (US)

(*) Notice: Subject to any disclaimer, the term of this patent is extended or adjusted under 35 U.S.C. 154(b) by 0 days.

(21) Appl. No.: 14/757,755

(22) Filed: Dec. 23, 2015

Related U.S. Application Data

(60) Provisional application No. 62/096,328, filed on Dec. 23, 2014.

(51) Int. Cl.
*H01L 23/40* (2006.01)
*H01L 23/467* (2006.01)
*H01L 23/367* (2006.01)

(52) U.S. Cl.
CPC ........ *H01L 23/4006* (2013.01); *H01L 23/467* (2013.01); *H01L 23/3672* (2013.01); *H01L 2023/4056* (2013.01)

(58) Field of Classification Search
CPC ............ H01L 2023/4037; H01L 23/40; H01L 2023/4043; H01L 2023/4056; H01L 2023/4068
See application file for complete search history.

(56) References Cited

U.S. PATENT DOCUMENTS

| | | | | |
|---|---|---|---|---|
| 5,097,318 A | * | 3/1992 | Tanaka | H01L 23/057 257/690 |
| 5,375,655 A | * | 12/1994 | Lee | F28F 3/02 165/185 |
| 6,252,774 B1 | * | 6/2001 | Rife | H01L 23/3675 257/727 |
| 2011/0277277 A1 | * | 11/2011 | Chen | H01L 23/4093 24/298 |

* cited by examiner

*Primary Examiner* — Hung Q Nguyen
*Assistant Examiner* — Mark L. Greene
(74) *Attorney, Agent, or Firm* — Ronald R. Kilponen (57) ABSTRACT

A heat transfer cooling module is described. One embodiment of the module has a plate attached to a bracket. A tower is affixed the plate. One end of the tower can be in contact with the heat source. The opposite end of the tower has a radiator attached which dissipates the heat that travels from the first end of the tower to the opposite end of the tower. Both the tower and the radiator are made from efficient materials for the transfer of heat. Another embodiment of the heat transfer cooling module is shown where the device is in two pieces, the first a fin module affixed to a bracket. The heat source is in contact with a base of the fin module where the heat travels through the base, to the fins where it dissipates to ambient.

5 Claims, 13 Drawing Sheets

HEAT TRANSFER COOLING MODULE

FIELD

The present version of these embodiments relate generally to the field of devices used to cool heat sources.

BACKGROUND

These embodiments relate to heat transfer and cooling modules, and more particularly to heat transfer cooling modules that can be used to cool electronics such as LED's, computers and other electronics that need to be operated below a certain temperature.

For the foregoing reasons, there is a need for a heat transfer cooling module that has the features described below.

OBJECTIVES

A first objective of these embodiments is to provide a device that is relatively easy to manufacture.

Another objective of these embodiments is to provide a device that is relatively cheap to manufacture.

It is yet another objective of these embodiments is to provide a device that can efficiently transfer heat away from a heat source to ambient.

Another objective of these embodiments is to provide a device that can dissipate heat quickly once transferred from the heat source.

It is a still further object of these embodiments to provide a device that can be easily assembled.

Another objective of these embodiments is to provide a device that can be packaged easily within a given space.

These together with other objective of these embodiments, along with various features of novelty which characterize these embodiments, are pointed out with particularity in the claims annexed hereto and forming a part of this disclosure. For a better understanding of this device, its operating advantages and the specific objectives attained by its uses, reference should be had to the accompanying drawings and descriptive matter in which there is illustrated a preferred embodiment of the device.

DETAILED DESCRIPTION OF THE PREFERRED EMBODIMENTS

Figure 1:
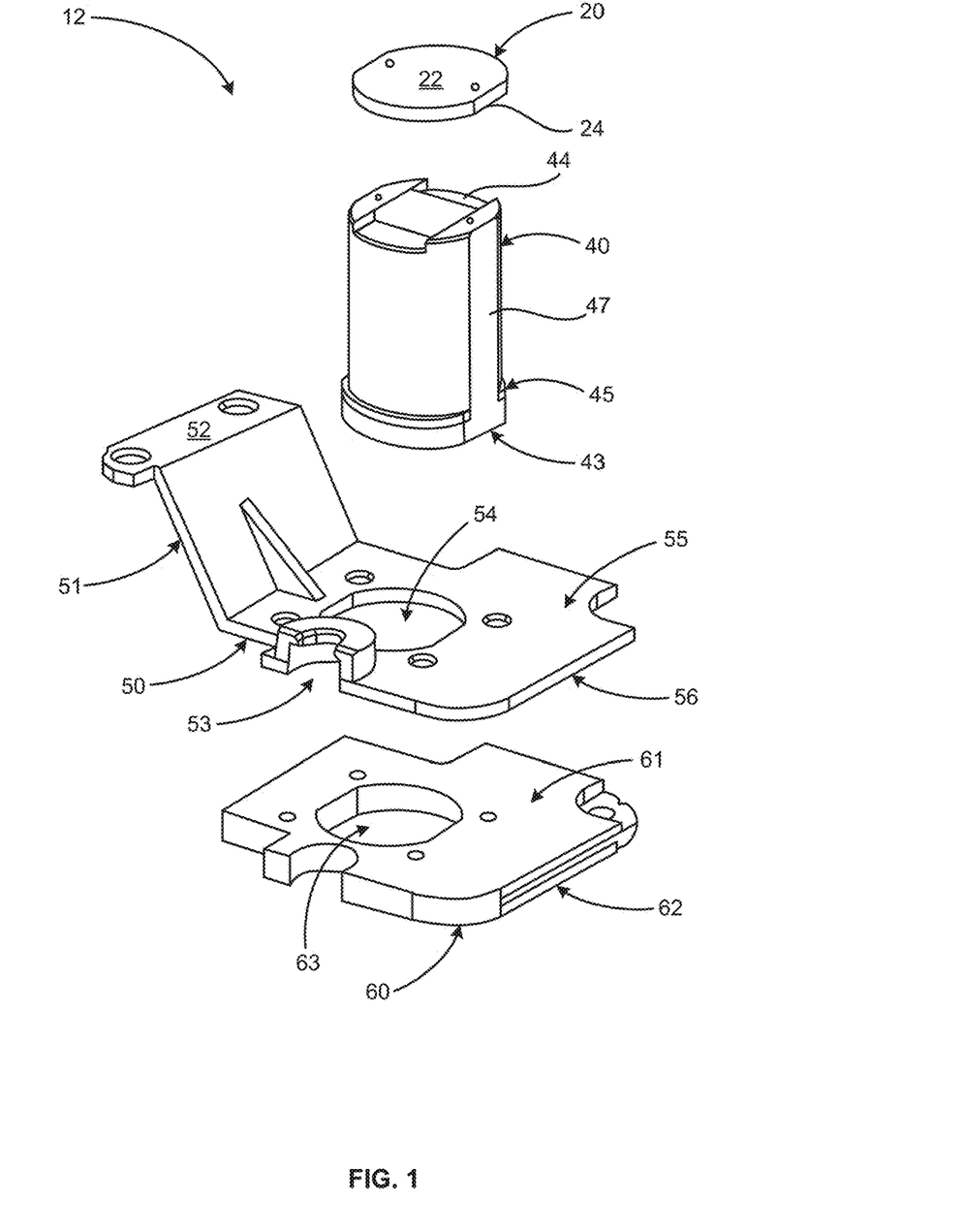
FIG. 1 shows an exploded view of one embodiment of the heat transfer cooling module.

Referring to the drawings in detail wherein like elements are indicated by like numerals, there is shown in FIG. 1 an exploded view of a heat transfer cooling module 12. The module 12 consists of several parts that can be attached together either with screws, adhesives or press fit together.

Figure 2:
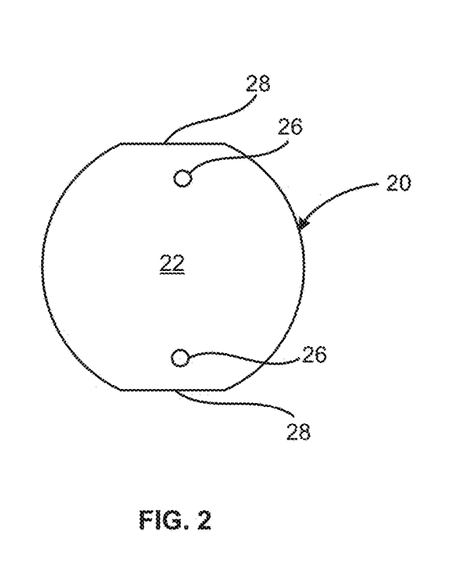
FIG. 2 shows a top view of one embodiment of the cover.
Figure 3:
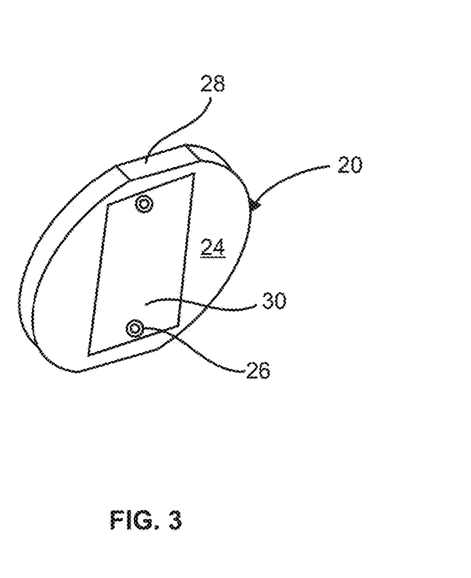
FIG. 3 shows a perspective view of one embodiment of the cover in FIG. 2.
Figure 4:
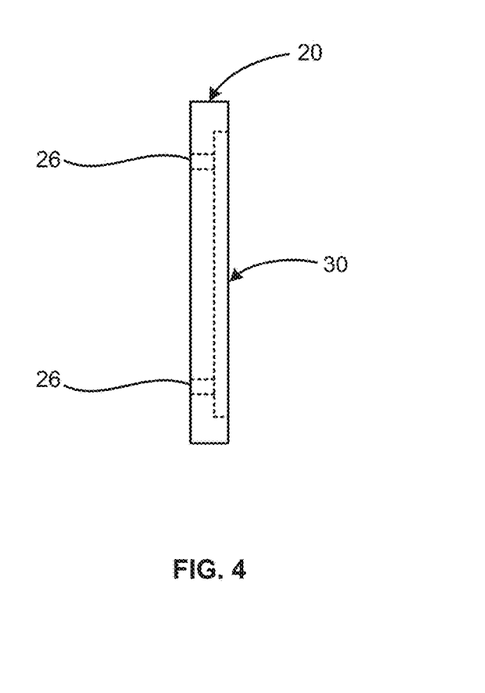
FIG. 4 shows a side view of one embodiment of the of the cover in FIG. 2.

In FIG. 2 is shown a cover 20. The cover 20 can be manufactured from any material but one embodiment is made from a polymeric material. The cover 20 has a top 22 and a bottom 24. There are shown two holes 26 from the top 22 through to the bottom 24. In the bottom 24 is located a recess 30. FIGS. 3 & 4 show a perspective view and side view respectively of the cover 20. The cover 20 could also be overmolded from a polymeric material. As an example and not a limitation, this is where the cover is molded onto another element such as the tower 40 or radiator 70, 90.

The cover 20 can also be affixed via fasteners (not shown) to either the radiator 70, 90 or the tower 40, 200. The fasteners (not shown) could also be used to attach both the radiator 70, 90 and the cover 20 to the tower 40, 200.

Figure 5:
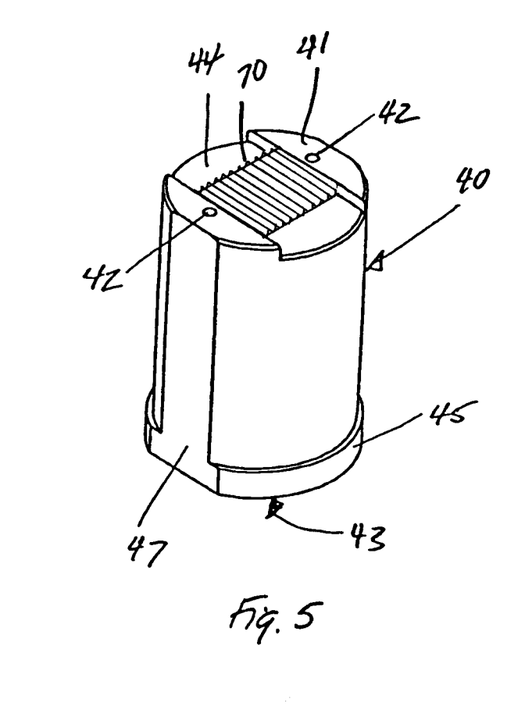
FIG. 5 shows a perspective view of one embodiment of the tower.

FIG. 5 shows a perspective view of one embodiment of the tower 40. This embodiment of the tower 40 is generally cylindrical in shape and has a flat 47 on one side and a second flat 47 on the opposite side of the tower 40. The tower 40 has a top 41 and a bottom 43. Located near the bottom 43 is a shoulder 45 around the perimeter. There is no shoulder 45 at the perimeter at the area that has the flats 47, best seen in FIG. 5. While this embodiment shows a generally cylindrical tower 40 it should be understood that other profiles are anticipated particularly those that could be efficiently cut from bar stock or extruded.

Figure 11:
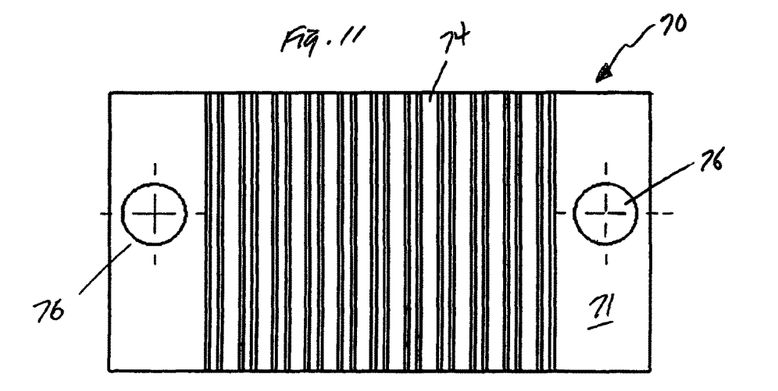
FIG. 11 shows a top view of one embodiment of the rolled radiator in FIG. 9.

At the top 41 of tower 40 is located a platform 44, FIG. 5. The platform 44 is an area for attaching a radiator 70 which can be affixed with fasteners or could be press fit. One embodiment of a radiator 70 is shown housed within the platform 44, FIG. 6. Alternatively, the radiator 70 could have holes 76, FIG. 11, for affixing the radiator 70 to the top 41 of the tower 40. The tower 40 is meant to conduct heat from the bottom 43 to the top 41 where it is dissipated by the radiator 70. The tower 40 should thereby be manufactured from a material that has good thermal conductivity.

Figure 6:
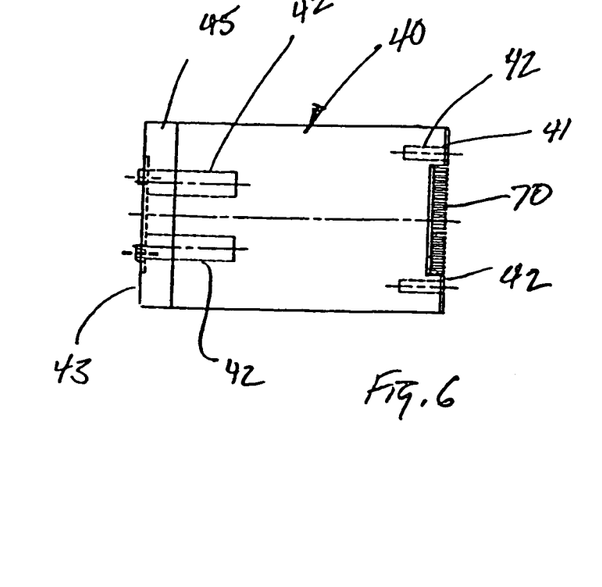
FIG. 6 shows a side view of one embodiment of the tower of FIG. 5.

FIG. 6 shows a side view of the tower 40. The bottom 43 can have holes 42 for the attachment of the heat source or other components.

Figure 7:
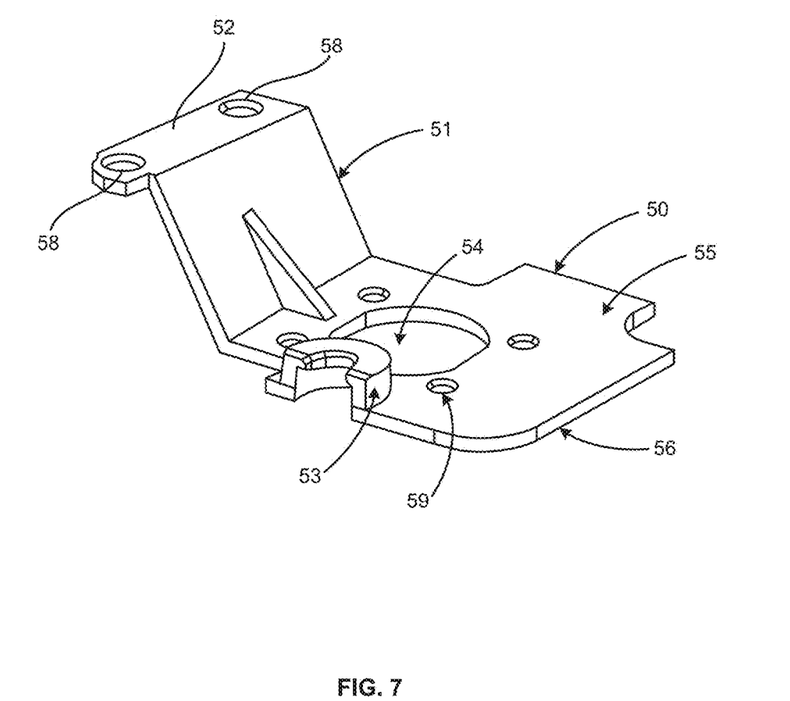
FIG. 7 shows a perspective view of one embodiment of the bracket.

FIG. 7 shows a perspective view of one embodiment of a bracket 50. The bracket 50 has a top 55 surface and a bottom 56 surface. One embodiment of the bracket 50 can be stamped and another embodiment can be deep drawn. The bracket 50 also has an arm 51 which angles away from the top 55 surface at a predetermined angle. A rib 57 can also be included to strengthen the arm 51. A landing 52 is formed at the end of the arm 51. The landing can have holes 58 there through for affixing to other components (not shown). This embodiment of the bracket 50 has a tower hole 54 for housing the tower 40. There can also be holes 59 in the bracket 50 for affixing to other components, for example to the tower 40 or the plate 60, FIG. 8. The bracket 50 can also have a boss 53 for attachment to other components such as the heat source (not shown). Depending upon the configuration of the heat transfer cooling module 12 the bracket could be affixed directly to the heat source.

Figure 8:
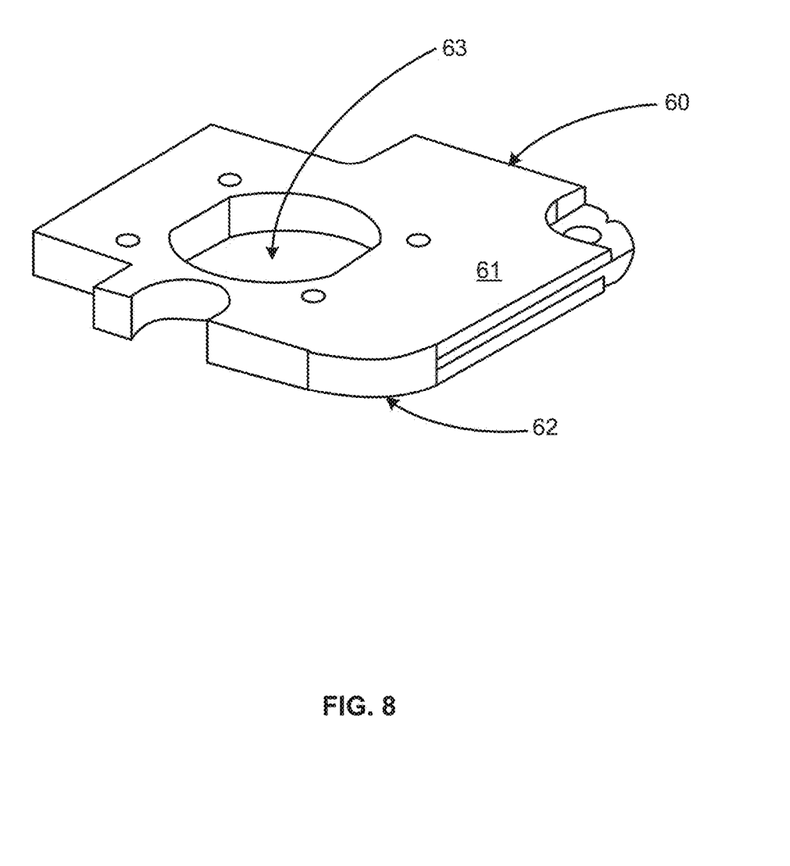
FIG. 8 shows a perspective view of one embodiment of the plate.

FIG. 8 shows a top perspective view of a plate 60. The plate 60 can be stamped or machined from a material that has good thermal conductivity and good heat capacity flow. The plate 60 has a top 61 and a bottom 62. There is also a hole 63 that is meant to be co-linear with the tower hole 54 in the bracket 50, FIG. 7. Various additional holes can exist between the top 61 and the bottom 62 for affixing components together or affixing to other components (not shown).

Figure 9:
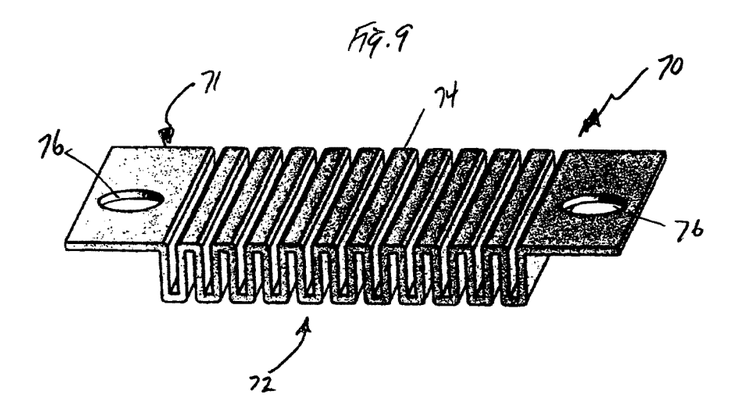
FIG. 9 shows a perspective view of one embodiment of the rolled radiator.
Figure 10:
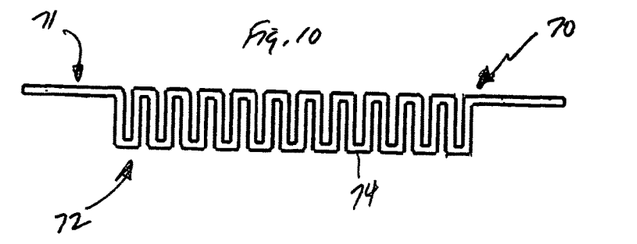
FIG. 10 shows a side view of one embodiment of the rolled radiator in FIG. 9.

FIG. 9 shows a top perspective view of a rolled radiator 70. The rolled radiator 70 can be manufactured by rolling thin material with a roll forming tool. The rolled radiator 70 has a top 71 and a bottom 72 with fins 74 between. Near each end of the rolled radiator 70 can be located holes 76 for attaching the radiator to the cover 20, tower 40 or both. The radiator 70 could also be designed to be installed as a press fit.

Figure 12:
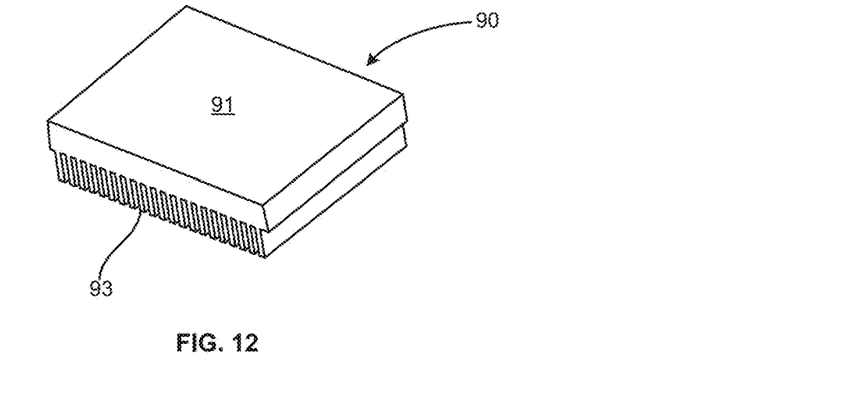
FIG. 12 shows a perspective view of one embodiment of the extruded radiator.
Figure 13:
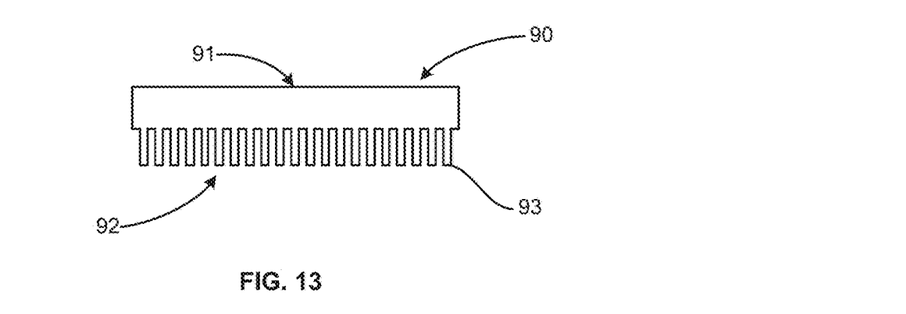
FIG. 13 shows a side view of one embodiment of the extruded radiator in FIG. 12.
Figure 14:
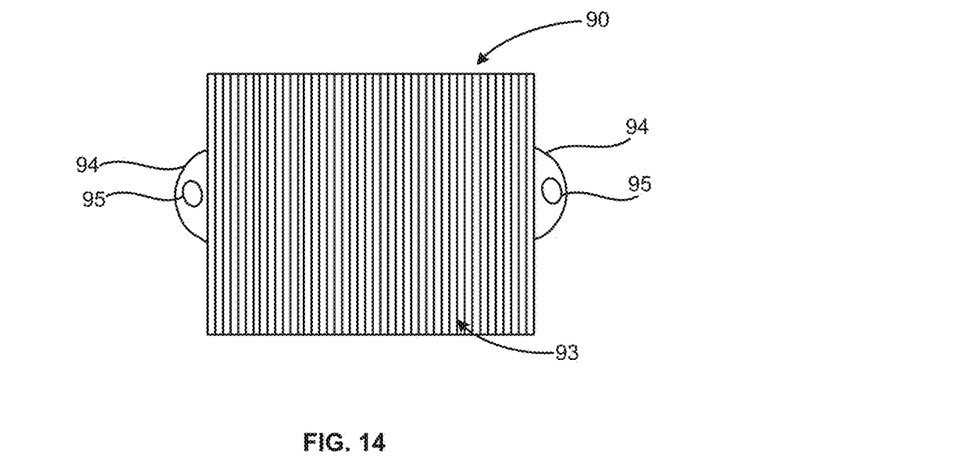
FIG. 14 shows a bottom view of one embodiment of the extruded radiator.

FIG. 12 shows a perspective view of another embodiment of a radiator, extruded radiator 90. This embodiment could be extruded from a material that has good thermal conductivity. The extruded radiator 90 has a top 92 and a bottom 91. The top 92 has fins 93 which extend from the top 92 towards the bottom 91. The fins 93 are spaced and have a length that optimizes the transfer of heat from the top 92. The bottom 91 can also be affixed to the platform 44 of the tower 40, FIG. 5. FIG. 13 shows a side view of the extruded radiator 90 and FIG. 14 shows a top view of another embodiment of extruded radiator 90 with the addition of ears 94 which can have holes 95 for affixing the radiator 90 to the platform 44 of tower 40.

Figure 15:
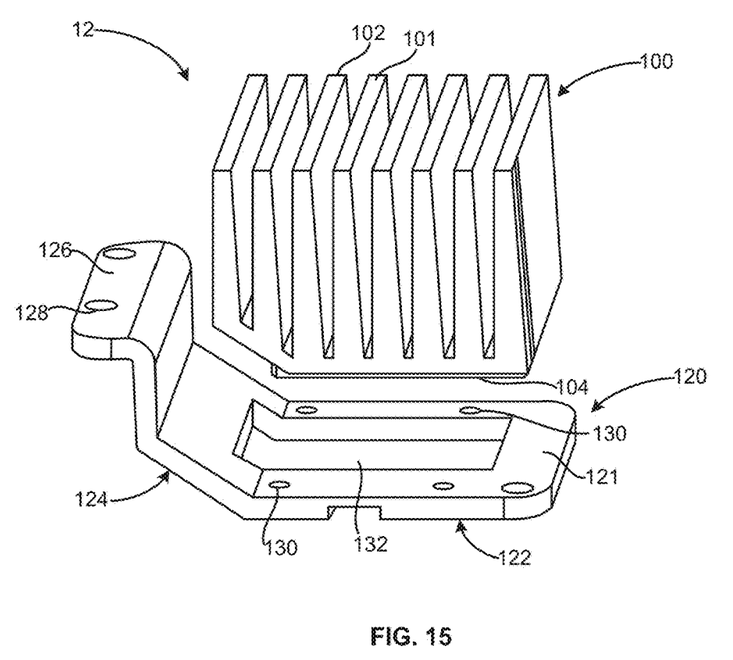
FIG. 15 shows a top perspective exploded view of another embodiment of heat transfer cooling module.

FIG. 15 shows an alternative embodiment of the heat transfer cooling module 12. This embodiment has two pieces; a fin module 100 and a bracket 120. The fin module 100 has a base 104 with a plurality of fins 102 extending roughly parallel to one another from the base 104 forming a top 101. The embodiment of the fin module 100 could be extruded from a material that has high thermal conductivity and finish machined.

The bracket 120 has a top 121 and a bottom 122. An arm 124 extends to an elevation from the main portion of the bracket 120 forming an elevated platform 126. Platform 126 can have holes 128. The bracket 120 could be stamped, machined or molded from a polymer to include overmolding.

The base 104 of the fin module 100 is sized to fit into the opening 132 of the bracket 120. The base 104 also has a holder 134 which can be used to affix the heat source (not shown). When the heat source is attached, the heat would flow into the base 134 of fin module 100 and into the fins 102 where it would dissipate into the ambient thereby keeping the heat source attached at holder 134 cool. The fin module 100 should be manufactured from a material that has good thermal conductivity and high heat capacity.

Figure 16:
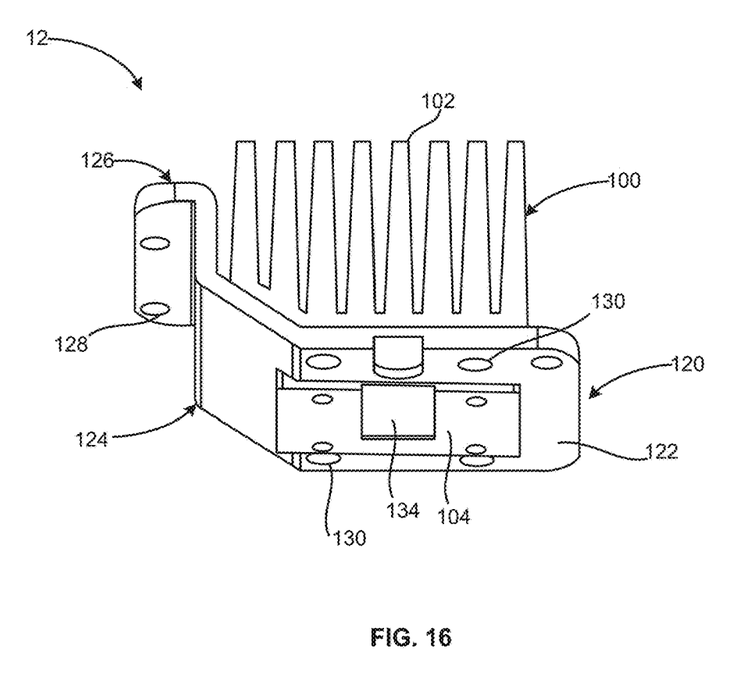
FIG. 16 shows a bottom perspective view of the embodiment of the heat transfer cooling module shown in FIG. 15 as assembled.

FIG. 16 shows a bottom perspective view of the assembled embodiments of FIG. 15.

Figure 17:
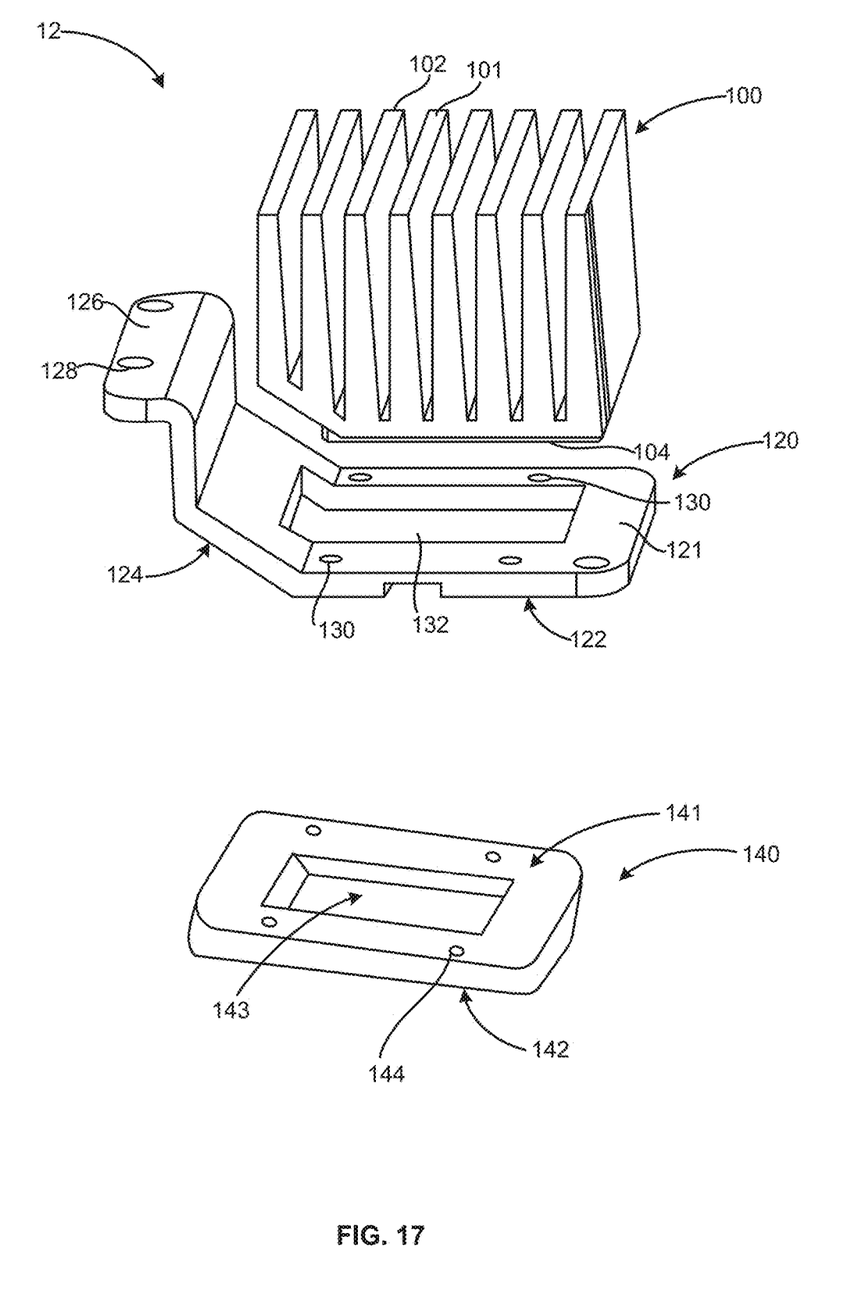
FIG. 17 shows a top perspective exploded view of another embodiment of the heat transfer cooling module.

FIG. 17 shows another embodiment of the heat transfer cooling module 12. In this embodiment, there is a fin module 100, a bracket 120 and a plate 140. The bracket 120 could be made of a thinner material that would be more cost efficiently stamped and the plate 140 could be made of a thicker material that also could be cost efficiently stamped.

In this embodiment, the plate 140, bracket 120 and fin module 100 have co-linear holes whereby these three components can be affixed to one another. The heat source (not shown) would likewise be affixed to the holder 134 on the base 104 of fin module 100 (not shown). The heat from the heat source would be transferred to the base 104 and into the fins 102 where it would be dissipated to the ambient. Heat would also be transferred to the plate 140 and bracket 120 although neither of these components are needed to be optimized for efficient heat transfer.

Figure 18:
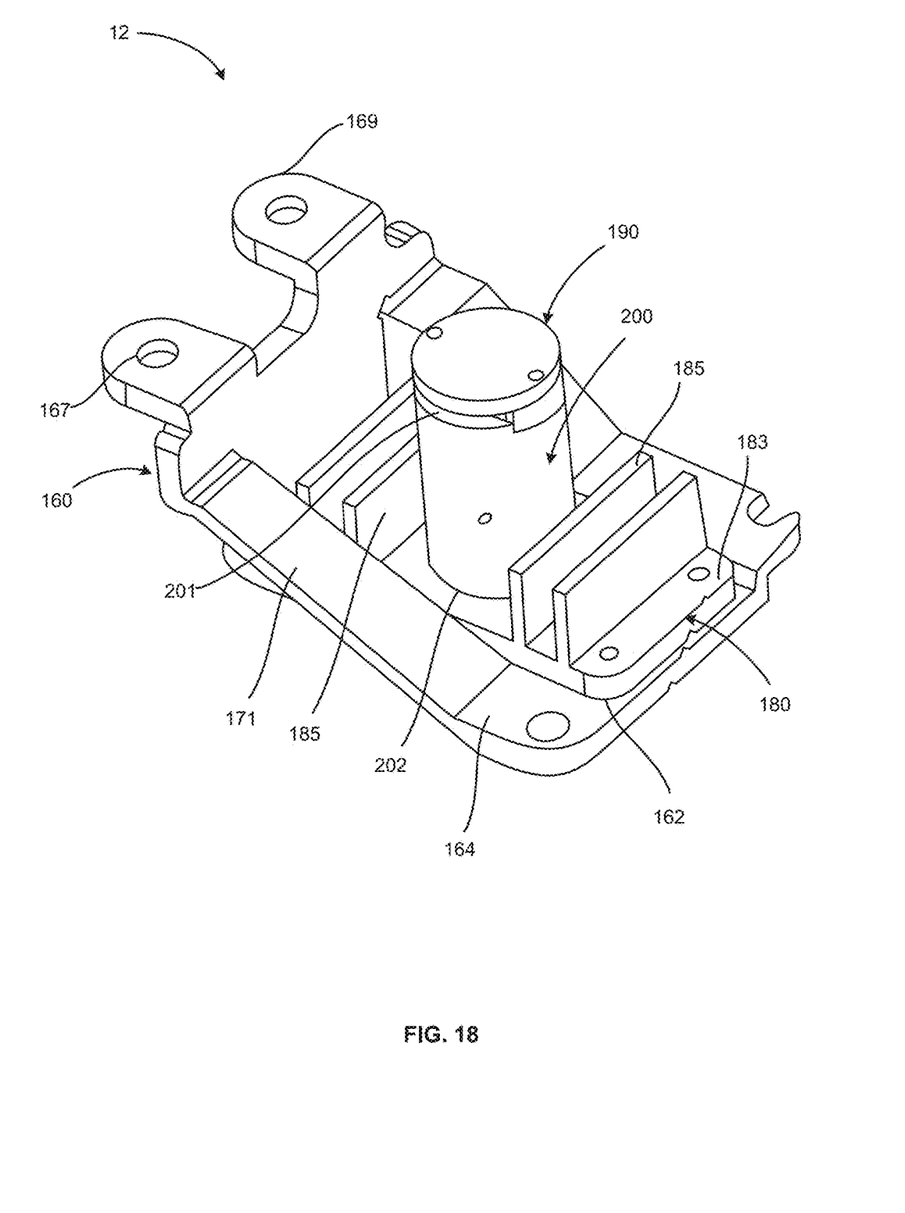
FIG. 18 shows a top perspective view of another embodiment of the heat transfer cooling module.

FIG. 18 shows another embodiment of the heat transfer cooling module 12. This embodiment comprises a bracket 160, a plate 180 and tower 200. The bracket 160 has a top 164 and bottom 165 and an arm 171 extending from the top 164, FIG. 18. The arm 171 angles to form a pair of tabs 169 with holes 167.

Figure 19:
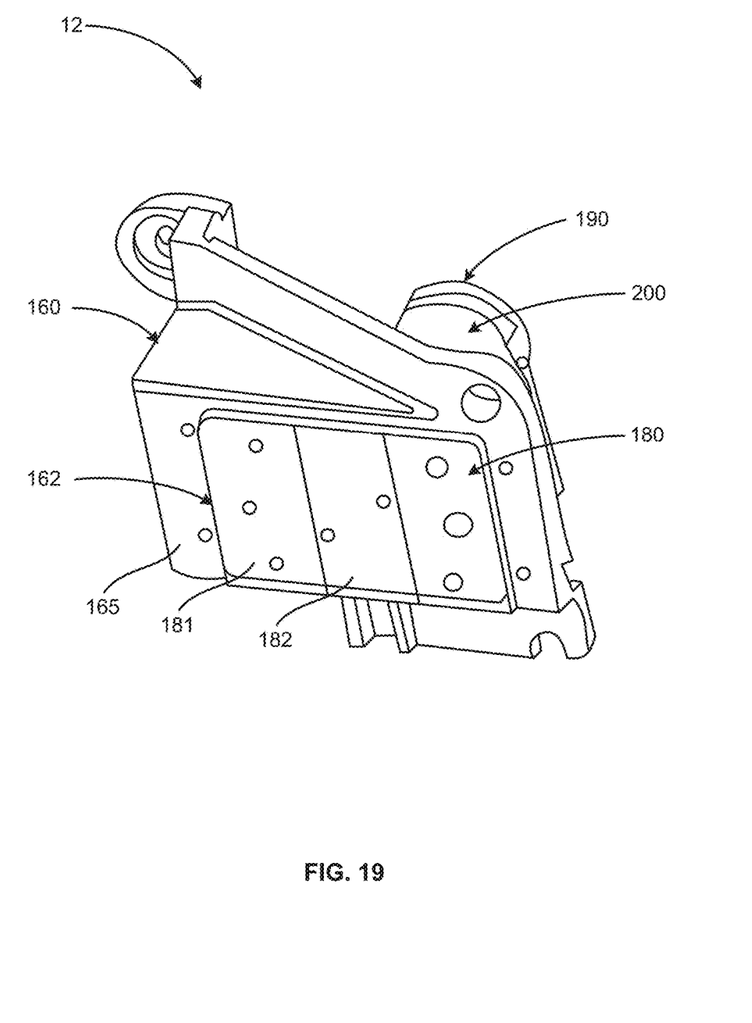
FIG. 19 show a bottom perspective view of the heat transfer cooling module in FIG. 18.

The plate 180 has a top 183 (FIG. 18) and a bottom 181 (FIG. 19). For manufacturing ease and cost efficiency, the plate 180 can be extruded and the bracket 160 could be stamped or deep drawn. The tower 200 could be extruded and machined. The tower 200 has a top 201 and a bottom 202, FIG. 18. Both the plate 180 and tower 200 should be manufactured from material having high thermal conductivity and capacity. This embodiment is similar to the embodiments in FIGS. 15,16 in that the plate 180 has a bottom 181 that extends through an opening 162 in the bracket 160, FIG. 19. The heat source (not shown) could then be affixed to the plate 180 anywhere on the bottom 181 but most efficient heat transfer would occur directly below the tower 200 at the area of the holder 182, FIG. 19. Various location and attachment holes are shown both for affixing these components together and the affixing module to other components (not shown).

In this embodiment the heat would transfer from the heat source attached to holder 182 to the bottom 181 of plate 180 and into the tower 200 where it is dissipated via the radiator (not shown) which is located below the cover 190. Heat would also dissipate through the fins 185 and also through the plate 180 and bracket 160 although neither the plate nor bracket are necessarily optimized for heat transfer.

Figure 20:
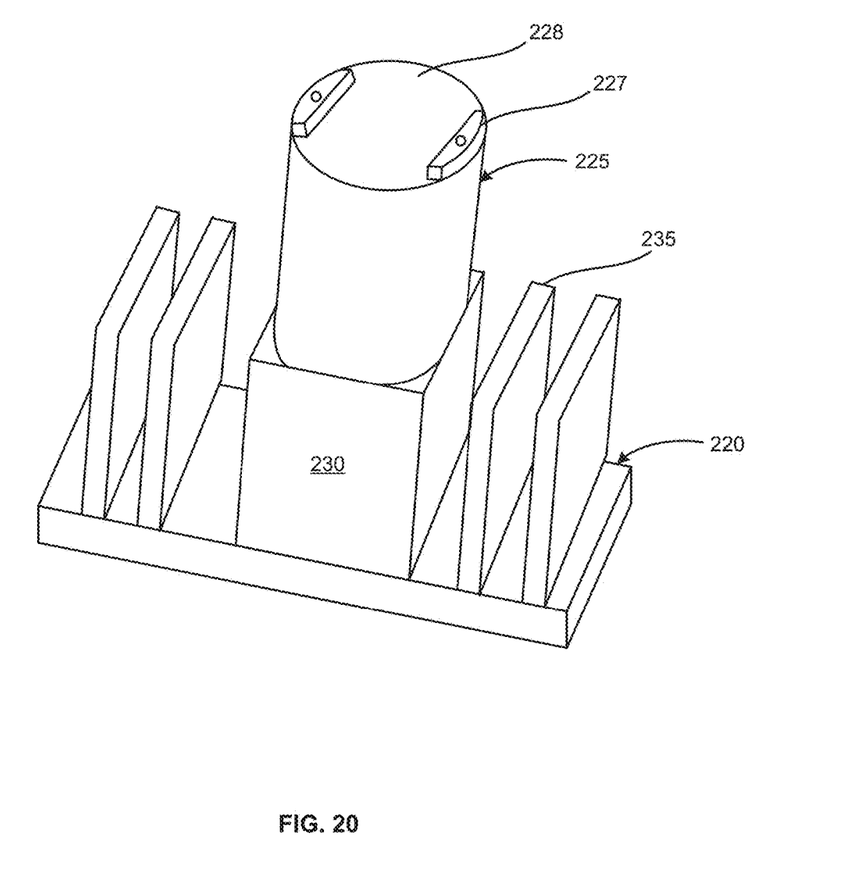
FIG. 20 shows a top perspective view of another embodiment of a modified plate and tower assembly.

FIG. 20 shows an alternative embodiment of a plate 220 and tower 225. In this embodiment, plate 220 can have an elevated base 230 to which the tower 225 is mounted. Plate 220 can also have a plurality of fins 235. The fin 235 sizes can be modified in both length, width and number dependent on how much heat dissipation is needed to cool the heat source. This embodiment also shows two bosses 227, one on each side of a flat 228. The flat 228 is provided to house a radiator 70, 90, as an example and not a limitation, those radiators shown in FIGS. 9-11 or FIGS. 12-14 and others can be used. Alternatively, the radiators 70, 90 could be press fit on the flat 228 of the tower 225.

Figure 21:
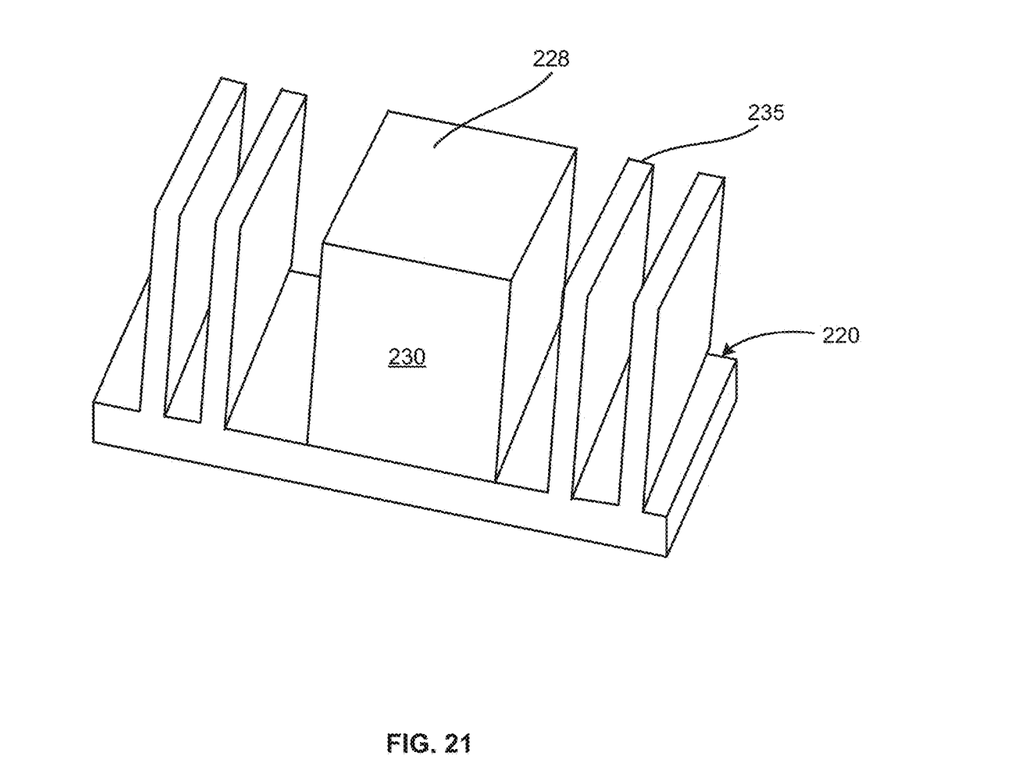
FIG. 21 shows a top perspective view of another embodiment of a modified plate and tower assembly.

FIG. 21 shows an alternative embodiment of a combined plate 220 and base 230. In this embodiment the plate 220 can be extruded to include the base 230. The base 230 could be taller or shorter than that shown. The base 230 could then be machined to change the profile to make it round or finned or even to have the flat 228 machined to include fins (not shown) thereby eliminating the need to add a radiator 70, 90. This could allow a cheaper component and allow additional design flexibility. It should be recognized that more, fewer, different sized, spacings and number of fins 235 could be included.

It will now be apparent to those skilled in the art that other embodiments, improvements, details and uses can be made consistent with the letter and spirit of the foregoing disclosure and within the scope of this application which is limited only by the scope of the following claims construed in accordance with patent law, including the doctrine of equivalents.

Parts Numbering Listing for Heat Sink Cooling Module
- 12. Heat transfer module
- 20. Cover
- 22. Top
- 24. Bottom
- 26. Hole
- 28. Flat
- 30. Recess
- 40. Tower
- 41. Top
- 42. Hole
- 43. Bottom
- 44. Platform
- 45. Shoulder
- 47. Flat
- 50. Bracket
- 51. Arm
- 52. Lauding
- 53. Boss
- 54. Tower Hole
- 55. Top
- 56. Bottom
- 58. Hole
- 59. Hole
- 60. Plate
- 61. Top
- 62. Bottom
- 63. Hole
- 70. Rolled radiator
- 71. Top
- 72. Bottom
- 74. Fin
- 76. Hole
- 90. Extruded Radiator
- 91. Top
- 92. Bottom
- 93. Fin
- 94. Ear
- 95. Hole
- 100. Fin module
- 102. Fin
- 104. Base
- 120. Bracket
- 121. Top
- 122. Bottom
- 124. Arm
- 126. Platform
- 128. Hole
- 130. Hole
- 132. Opening
- 134. Holder
- 140. Plate
- 141. Top
- 142. Bottom
- 143. Opening
- 144. Hole

What is claimed is:

1. A heat transfer cooling module for transferring heat from a heat source to dissipate to ambient, the heat transfer cooling module comprising:
   a plate having a top and a bottom, a holder located in the bottom of the plate, a plurality of rectangular solid fins extending from the top of the plate, the rectangular solid fins located on the top of the plate and extending from one side to an opposite side of the plate, the rectangular solid fins having a length greater than their height;
   a bracket having a top and a bottom, an arm extending from the top of the bracket at a predetermined angle forming a pair of tabs, the tabs parallel to the bottom of the plate, an opening in the bracket from the top of the bracket to the bottom of the bracket, the opening corresponding in size to the bottom of the plate, the bottom of the plate located in the opening in the bracket such that the bottom of the plate extends below the bottom of the bracket;
   a cylindrically shaped tower having a top and a bottom, the top of the tower having a platform cut therein, the bottom of the tower affixed adjacent to the top of the plate and the tower located between the plurality of rectangular solid fins, the top of the tower extending beyond the top of the rectangular solid fins, the tower dissipating heat from a single heat source;
   a cover having a top and a bottom, the bottom of the cover affixed to the top of the tower;
   a radiator having a top and a bottom and a plurality of radiator fins, the radiator affixed to the top of the tower and located in the platform between the top of the tower and the bottom of the cover; and
   whereby the single heat source is located in the holder in the bottom of the plate and the heat transfers to the plate and into the tower and flows into the radiator and is expelled into the ambient and also flows into the plurality of solid rectangular fins and is expelled into the ambient.

2. The heat transfer cooling module of claim 1, further comprising:
   the bottom of the radiator having a solid bottom, the plurality of radiator fins evenly spaced and extending from the solid bottom to and forming the top of the radiator, the radiator formed by extrusion.

3. The heat transfer cooling module of claim 1, further comprising:
   the radiator is formed by rolling thin material, the radiator fins being non-cylindrical fins, the radiator fins evenly spaced and extending from the bottom of the radiator to the top of the radiator.

4. The heat transfer cooling module of claim 1, further comprising:
   a base extending from the top of the plate, the bottom of the tower affixed to a top of the base.

5. The heat transfer cooling module of claim 1, further comprising:
   the top of the tower having first and second bosses, the first and second bosses each having a top, the first and second bosses located across from one another on the top of the tower, the bottom of the cover attached to the top of the first and second bosses.

* * * * *